United States Patent
Han et al.

(10) Patent No.: US 11,394,363 B2
(45) Date of Patent: Jul. 19, 2022

(54) BULK-ACOUSTIC WAVE RESONATOR

(71) Applicant: Samsung Electro-Mechanics Co., Ltd., Suwon-si (KR)

(72) Inventors: Won Han, Suwon-si (KR); Tae Yoon Kim, Suwon-si (KR); Chang Hyun Lim, Suwon-si (KR); Sang Uk Son, Suwon-si (KR); Jae Hyoung Gil, Suwon-si (KR); Dae Hun Jeong, Suwon-si (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 130 days.

(21) Appl. No.: 16/930,885

(22) Filed: Jul. 16, 2020

(65) Prior Publication Data
US 2021/0313950 A1    Oct. 7, 2021

(30) Foreign Application Priority Data
Apr. 6, 2020  (KR) .................. 10-2020-0041508

(51) Int. Cl.
*H03H 9/02* (2006.01)
*H03H 9/13* (2006.01)
*H03H 9/17* (2006.01)

(52) U.S. Cl.
CPC .... *H03H 9/02118* (2013.01); *H03H 9/02015* (2013.01); *H03H 9/02157* (2013.01); *H03H 9/131* (2013.01); *H03H 9/174* (2013.01)

(58) Field of Classification Search
CPC .......... H03H 9/02015; H03H 9/02157; H03H 9/131; H03H 9/174; H03H 9/02118; H03H 9/171; H03H 9/54
USPC ......................................... 333/186, 187, 188
See application file for complete search history.

(56) References Cited

U.S. PATENT DOCUMENTS

| | | | |
|---|---|---|---|
| 9,401,691 B2 * | 7/2016 | Zou ..................... | H03H 3/013 |
| 10,128,813 B2 | 11/2018 | Thalhammer et al. | |
| 10,177,732 B2 | 1/2019 | Yokoyama | |
| 2017/0257076 A1 | 9/2017 | Kaneko et al. | |
| 2018/0254764 A1 | 9/2018 | Lee et al. | |

FOREIGN PATENT DOCUMENTS

| | | | |
|---|---|---|---|
| JP | 6510996 B2 | 5/2019 | |
| KR | 10-2018-0101129 A | 9/2018 | |

* cited by examiner

*Primary Examiner* — Rakesh B Patel
*Assistant Examiner* — Jorge L Salazar, Jr.
(74) *Attorney, Agent, or Firm* — NSIP Law

(57) ABSTRACT

A bulk-acoustic wave resonator includes: a first electrode disposed above a substrate; a piezoelectric layer disposed to cover at least a portion of the first electrode; and a second electrode disposed to cover at least a portion of the piezoelectric layer. A plurality of steps are formed in any one or any combination of any two or more of the first electrode, the piezoelectric layer, and the second electrode in an active region in which the first electrode, the piezoelectric layer, and the second electrode are all disposed to overlap one another.

29 Claims, 13 Drawing Sheets

BULK-ACOUSTIC WAVE RESONATOR

CROSS-REFERENCE TO RELATED APPLICATIONS

This application claims the benefit under 35 U.S.C. § 119(a) of Korean Patent Application No. 10-2020-0041508 filed on Apr. 6, 2020 in the Korean Intellectual Property Office, the entire disclosure of which is incorporated herein by reference for all purposes.

BACKGROUND

1. Field

The following description relates to a bulk-acoustic wave resonator.

2. Description of Related Art

A bulk-acoustic wave (BAW) filter is composed of bulk-acoustic wave (BAW) resonators. If a quality factor (Q) performance of the BAW resonators is good, skirt characteristics that can select only desired bands in the BAW filters are good, and the performance of insertion loss and attenuation is improved. In order to improve the quality factor (Q) performance of the anti-resonance point in a BAW resonator, a frame may be formed around the resonator, to reflect a lateral wave generated during resonance into the resonator to trap the resonance energy in the active area. In general, the frame is formed from the same material as that of an upper electrode, and the frame is formed to be thicker than a remainder of the upper electrode disposed in an active area of the BAW resonator. However, when only a single frame is provided, there is a limitation in implementing a high quality factor (Q) performance.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bulk-acoustic wave resonator includes: a first electrode disposed above a substrate; a piezoelectric layer disposed to cover at least a portion of the first electrode; and a second electrode disposed to cover at least a portion of the piezoelectric layer. A plurality of steps are formed in any one or any combination of any two or more of the first electrode, the piezoelectric layer, and the second electrode in an active region in which the first electrode, the piezoelectric layer, and the second electrode are all disposed to overlap one another.

A thickness of one of the first electrode, the piezoelectric layer, and the second electrode at an edge of the active region may be greater than a thickness of the one of the first electrode, the piezoelectric layer, and the second electrode in a central portion of the active region to form a step, among the plurality of steps.

The bulk-acoustic wave resonator may further include an insertion layer, wherein a portion of the insertion layer is disposed between the first electrode and the piezoelectric layer.

A thickness of the second electrode in a first region of the bulk-acoustic wave resonator may be smallest compared to thicknesses of the second electrode in other regions in the active region. A thickness of the second electrode in a second region of the bulk-acoustic wave resonator, disposed outside of the first region, may be greater than the thickness of the second electrode in the first region. A thickness of the second electrode in a third region of the bulk-acoustic wave resonator, disposed outside of the second region, may be greater than the thickness of the second electrode in the second region. The second electrode may overlap the piezoelectric layer, the first electrode, and the insertion layer in a fourth region of the bulk-acoustic wave resonator, disposed outside of the third region.

The second electrode may overlap the piezoelectric layer, the insertion layer, and the first electrode in a fifth region of the bulk-acoustic wave resonator, disposed outside of the fourth region, or the second electrode, the piezoelectric layer, and the insertion layer may overlap one another in the fifth region.

A sum of a width of the second region and a width of the third region may be 0.6 µm to 1.0 µm.

A width of a region in which an end portion of the second electrode overlaps the insertion layer may be 0.4 µm to 0.8 µm.

A difference between the thickness of the second electrode in the first region and the thickness of the second electrode in the second region may be 800 Å to 1200 Å.

A thickness of the piezoelectric layer in a first region of the bulk-acoustic wave resonator may be smallest compared to thicknesses of the piezoelectric layer in other regions in the active region. A thickness of the piezoelectric layer in a second region of the bulk-acoustic wave resonator, disposed outside of the first region, may be greater than the thickness of the piezoelectric layer in the first region. A thickness of the piezoelectric layer in a third region of the bulk-acoustic wave resonator, disposed outside of the second region, may be greater than the thickness of the piezoelectric layer in the second region. The piezoelectric layer, the first and second electrodes, and the insertion layer may overlap one another in a fourth region of the bulk-acoustic wave resonator, disposed outside of the third region.

The piezoelectric layer, the insertion layer, and the first electrode may overlap one another in a fifth region of the bulk-acoustic wave resonator, disposed outside of the fourth region, or the second electrode, the piezoelectric layer, and the insertion layer may overlap one another in the fifth region.

A thickness of the first electrode in a first region of the bulk-acoustic wave resonator may be smallest compared to thicknesses of the first electrode in other regions in the active region. A thickness of the first electrode in a second region of the bulk-acoustic wave resonator, disposed outside of the first region, may be greater than the thickness of the first electrode the first region. The first electrode may be disposed in a third region of the bulk-acoustic wave resonator, disposed outside of the second region. The first and second electrodes, and the insertion layer may overlap one another in a fourth region of bulk-acoustic wave resonator, disposed outside of the third region.

The piezoelectric layer, the insertion layer, and the first electrode may overlap one another in a fifth region of bulk-acoustic wave resonator, disposed outside of the fourth region, or the second electrode, the piezoelectric layer, and the insertion layer may overlap one another in the fifth region.

An acoustic impedance of the piezoelectric layer may be greater than an acoustic impedance of the first and second electrodes.

The bulk-acoustic wave resonator may further include: an etch stop portion disposed to surround the cavity; a sacrificial layer disposed to surround the etch stop portion; and a metal pad connected to the first electrode and the second electrode.

In another general aspect, A bulk-acoustic wave resonator includes: a first electrode disposed above a substrate; a piezoelectric layer disposed to cover at least a portion of the first electrode; a second electrode disposed to cover at least a portion of the piezoelectric layer; and an insertion layer partially disposed between the first electrode and the piezoelectric layer. A plurality of steps are formed by the insertion layer and a difference in thickness of regions of any one of the first electrode, the piezoelectric layer, and the second electrode, in an active region in which the first electrode, the piezoelectric layer, and the second electrode all overlap one another.

A thickness of the any one of the first electrode, the piezoelectric layer, and the second electrode in a first region of the bulk-acoustic wave resonator may be smallest compared to thicknesses of the any one of the first electrode, the piezoelectric layer, and the second electrode in other regions in the active region. A thickness of the any one of the first electrode, the piezoelectric layer, and the second electrode in a second region of the bulk-acoustic wave resonator, disposed outside of the first region, may be greater than the thickness of the any one of the first electrode, the piezoelectric layer, and the second electrode in the first region. A difference between the thickness of the any one of the first electrode, the piezoelectric layer, and the second electrode in the first region and the thickness of the any one of the first electrode, the piezoelectric layer, and the second electrode in the second region may be 800 Å to 1200 Å.

A thickness of the second electrode in a first region of the bulk-acoustic wave resonator may be smallest compared to thicknesses of the second electrode in other regions in the active region. A thickness of the second electrode in a second region of the bulk-acoustic wave resonator, disposed outside of the first region, may be greater than the thickness of the second electrode in the first region. A thickness of the second electrode in a third region of the bulk-acoustic wave resonator, disposed outside of the second region, may be greater than the thickness of the second electrode in the second region. The second electrode may overlap the piezoelectric layer, the first electrode, and the insertion layer in a fourth region of the second electrode, disposed outside of the third region.

The second electrode may overlap the piezoelectric layer, the insertion layer, and the first electrode in a fifth region of the bulk-acoustic wave resonator, disposed outside of the fourth region, or the second electrode, the piezoelectric layer, and the insertion layer may overlap one another in the fifth region.

A sum of a width of the second region and a width of the third region may be 0.6 μm to 1.0 μm.

A width of a region in which an end portion of the second electrode overlaps the insertion layer may be 0.4 μm to 0.8 μm.

The insertion layer may not be disposed in the third region.

A thickness of the piezoelectric layer in a first region of the bulk-acoustic wave resonator may be smallest compared to thicknesses of the piezoelectric layer in other regions in the active region. A thickness of the piezoelectric layer in a second region of the bulk-acoustic wave resonator, disposed outside of the first region, may be greater than the thickness of the piezoelectric layer in the first region. A thickness of the piezoelectric layer in a third region of the bulk-acoustic wave resonator, disposed outside of the second region, may be greater than the thickness of the piezoelectric layer in the second region. The piezoelectric layer, the first and second electrodes, and the insertion layer may overlap one another in a fourth region of the bulk-acoustic wave resonator, disposed outside of the third region.

The piezoelectric layer, the insertion layer, and the first electrode may overlap one another in a fifth region of the bulk-acoustic wave resonator, disposed outside of the fourth region, or the second electrode, the piezoelectric layer, and the insertion layer may overlap one another in the fifth region.

A thickness of the first electrode in a first region of the bulk-acoustic wave resonator may be smallest compared to thicknesses of the first electrode in other regions in the active region. A thickness of the first electrode in a second region of the bulk-acoustic wave resonator, disposed outside of the first region, may be greater than the thickness of the first electrode in the first region. The first electrode may be disposed in a third region of the bulk-acoustic wave resonator, disposed outside of the second region. The piezoelectric layer, the first and second electrodes, and the insertion layer may overlap one another in a fourth region of the bulk-acoustic wave resonator, disposed outside of the third region.

The piezoelectric layer, the insertion layer, and the first electrode may overlap one another in a fifth region of the bulk-acoustic wave resonator, disposed outside of the fourth region, or the second electrode, the piezoelectric layer, and the insertion layer may overlap one another in the fifth region.

An acoustic impedance of the piezoelectric layer may be greater than an acoustic impedance of the first and second electrodes.

In another general aspect, a bulk-acoustic wave resonator includes: a first electrode disposed above a substrate; a piezoelectric layer disposed to cover at least a portion of the first electrode; and a second electrode disposed to cover at least a portion of the piezoelectric layer. The first electrode, the piezoelectric layer, and the second electrode all overlap one another throughout an active region of the bulk-acoustic wave resonator. Any one of the first electrode, the piezoelectric layer, and the second electrode has a first thickness in a first region of the active region and a second thickness in a second region of the active region, disposed outside of the first region. The second thickness is greater than the first thickness.

The bulk-acoustic resonator may further include a step formed in the any one of the first electrode, the piezoelectric layer, and the second electrode by a difference between the first thickness and the second thickness.

The bulk difference between the first thickness and the second thickness may be 800 Å to 1200 Å.

The any one of the first electrode, the piezoelectric layer, and the second electrode may have a third thickness in a third region of the active region, disposed outside of the second region. The third thickness may be greater than the second thickness.

The bulk-acoustic wave resonator may further include an insertion layer partially disposed between the first electrode and the piezoelectric layer. The insertion layer may be disposed entirely outside of the third region.

Other features and aspects will be apparent from the following detailed description, the drawings, and the claims.

BRIEF DESCRIPTION OF DRAWINGS

FIG. 6 is an explanatory view illustrating the bulk-acoustic wave resonator of FIG. 1, according to an embodiment of.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
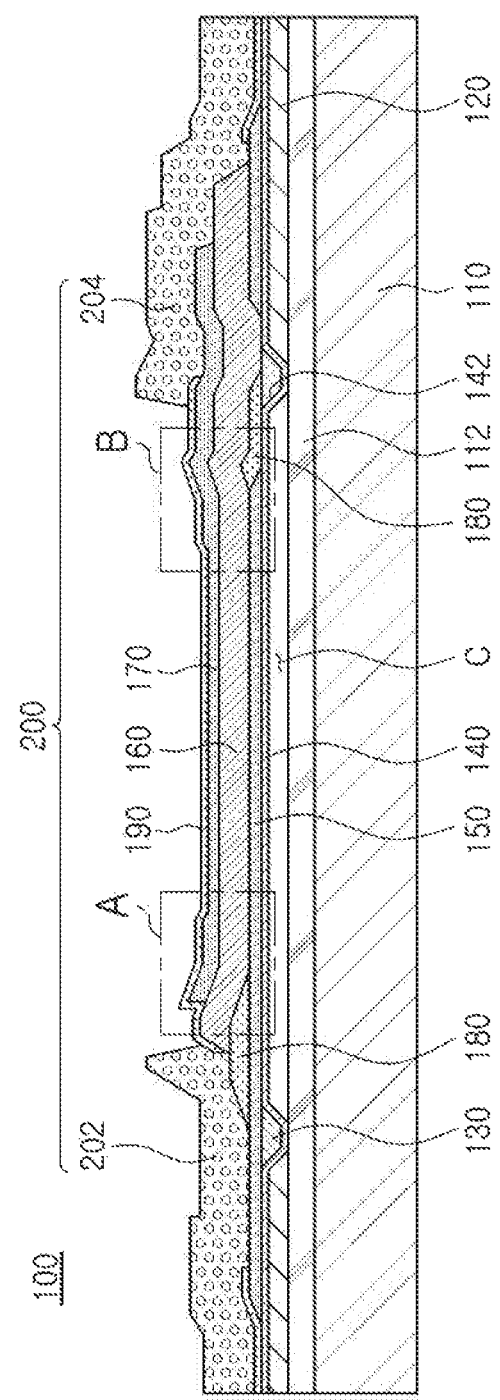
FIG. 1 is a schematic cross-sectional view illustrating a bulk-acoustic wave resonator, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," "lower," "front," "rear," and "side" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. For another example, if the device in the figures is turned around, an element described as being "front" relative to another element will then be "rear" relative to the other element. Thus, the term "front" encompasses both the front and rear orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
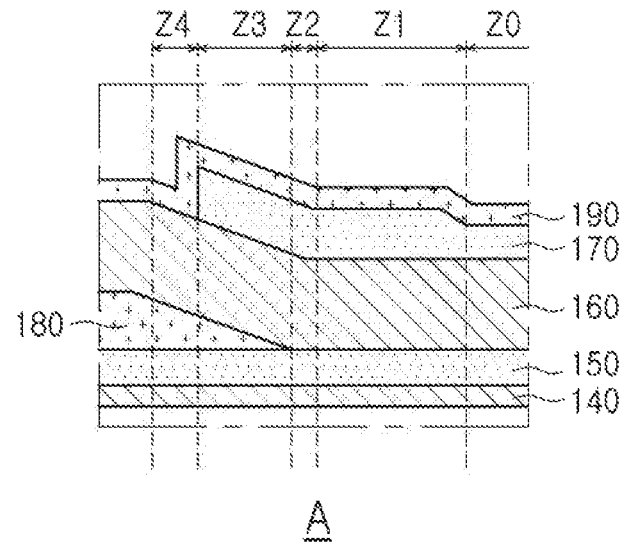
FIG. 2 is an enlarged view illustrating part A of FIG. 1.
Figure 3:
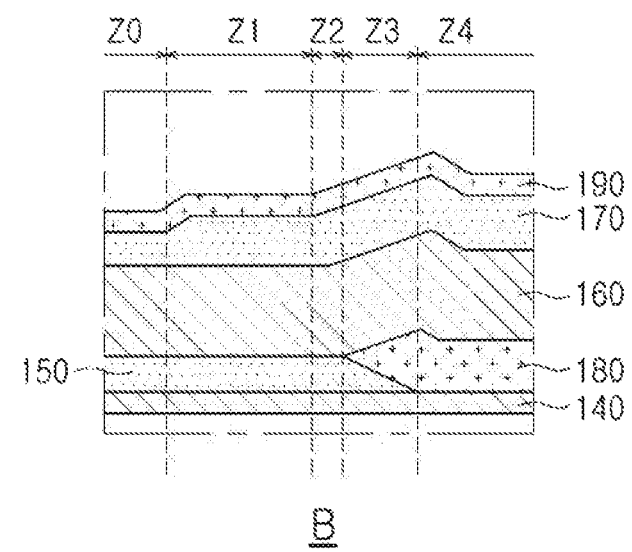
FIG. 3 is an enlarged view illustrating part B of FIG. 1.

FIG. 1 is a schematic cross-sectional view illustrating a bulk-acoustic wave resonator 100, according to an embodiment. FIG. 2 is an enlarged view illustrating part A of FIG. 1. FIG. 3 is an enlarged view illustrating part B of FIG. 1.

Referring to FIGS. 1 to 3, the bulk-acoustic wave resonator 100 may include, for example, a substrate 110, a sacrificial layer 120, an etch stop portion 130, a membrane layer 140, a first electrode 150, a piezoelectric layer 160, a second electrode 170, an insertion layer 180, a passivation layer 190, and a metal pad 200.

The substrate 110 may be a silicon substrate. For example, a silicon wafer or a silicon-on-insulator (SOI) type substrate may be used as the substrate 110.

An insulating layer 112 may be disposed on an upper surface of the substrate 110, and may electrically isolate the substrate 110 and a structure (e.g., layers and components) disposed thereon from each other. In addition, the insulating layer 112 may prevent the substrate 110 from being etched by an etching gas when a cavity C is formed in a manufacturing process.

In an example, the insulating layer 112 may be formed of any one or any combination of any two or more of silicon dioxide ($SiO_2$), silicon nitride ($Si_3N_4$), aluminum oxide ($Al_2O_3$), and aluminum nitride (AlN), and may be formed through any one of chemical vapor deposition, RF magnetron sputtering, and evaporation.

The sacrificial layer 120 may be formed on the insulating layer 112, and the cavity C and the etch stop portion 130 may be disposed in the sacrificial layer 120. The cavity C may be formed by removing a portion of the sacrificial layer 120 during manufacturing. As such, since the cavity C is formed in the sacrificial layer 120, the first electrode 150, as well as additional layers, disposed above the sacrificial layer 120 may be formed to be flat.

The etch stop portion 130 is disposed along a lateral/side boundary of the cavity C. The etch stop portion 130 is provided to prevent etching from being performed beyond a cavity region in a process of forming the cavity C. For example, the etch stop portion 130 may be disposed in a groove 142 of the membrane layer 140.

The membrane layer 140 forms a cavity C together with the substrate 110. In addition, the membrane layer 140 may be made of a material having low reactivity with the etching gas when removing the sacrificial layer 120. The membrane layer 140 may include a dielectric layer containing any one of silicon nitride ($Si_3N_4$), silicon oxide ($SiO_2$), manganese oxide (MgO), zirconium oxide ($ZrO_2$), aluminum nitride (AlN), lead acid lithium titanate (PZT), gallium arsenide (GaAs), hafnium oxide ($HfO_2$), aluminum oxide ($Al_2O_3$), titanium oxide ($TiO_2$), and zinc oxide (ZnO).

A seed layer (not shown) made of aluminum nitride (AlN) may be formed on the membrane layer 140. The seed layer may be disposed between the membrane layer 140 and the first electrode 150. The seed layer may be formed using a dielectric or metal having an HCP crystal structure in addition to aluminum nitride (AlN). As an example, the seed layer may be formed of titanium (Ti).

The first electrode 150 is formed on the membrane layer 140, and a portion of the first electrode 150 is disposed above the cavity C. In addition, the first electrode 150 may be configured as either one of an input electrode and an output electrode for inputting and outputting, respectively, an electrical signal such as a radio frequency (RF) signal, or the like.

As an example, the first electrode 150 may be formed using a conductive material such as molybdenum (Mo) or alloys thereof. However, the first electrode 150 is not limited to these examples, and the first electrode 150 may be made of a conductive material such as ruthenium (Ru), tungsten (W), iridium (Ir), platinum (Pt), copper (Cu), titanium (Ti), tantalum (Ta), nickel (Ni), chromium (Cr), or the like, or alloys of ruthenium (Ru), tungsten (W), iridium (Ir), platinum (Pt), copper (Cu), titanium (Ti), tantalum (Ta), nickel (Ni), or chromium (Cr).

The piezoelectric layer 160 is formed to cover at least the portion of the first electrode 150 disposed above the cavity C. The piezoelectric layer 160 is a portion that generates a piezoelectric effect that converts electrical energy into mechanical energy in a form of elastic waves, and may include, for example, an aluminum nitride (AlN) material.

In addition, dopants such as rare earth metal or transition metal may be doped into the piezoelectric layer 160. As an example, the rare earth metal used as a dopant may include any one or any combination of any two or more of scandium (Sc), erbium (Er), yttrium (Y), and lanthanum (La). Furthermore, the transition metal used as a dopant may include any one or any combination of any two or more of titanium (Ti), zirconium (Zr), hafnium (Hf), tantalum (Ta), and niobium (Nb). In addition, the piezoelectric layer 160 may also include magnesium (Mg), which is a divalent metal.

The piezoelectric layer 160 may be made of a material having low acoustic impedance compared to the acoustic impedance of the first electrode 150.

The acoustic impedance Z value may be expressed by the following Equation 1 as an intrinsic value of a material.

$$Z=\sqrt{(\rho * c)} \qquad \text{Equation (1)}$$

In Equation 1 above, ρ is density and c is an elastic modulus.

The second electrode 170 is formed to cover at least a portion of the piezoelectric layer 160 disposed above the cavity C. The second electrode 170 may be configured as either one of an input electrode and an output electrode for inputting and outputting, respectfully, an electrical signal such as a radio frequency (RF) signal. That is, when the first electrode 150 is configured as the input electrode, the second electrode 170 may be configured as the output electrode, and when the first electrode 150 is configured as the output electrode, the second electrode 170 may be configured as the input electrode.

However, the second electrode 170 is not limited to the above examples, and the second electrode 170 may be formed using a conductive material such as molybdenum (Mo) or alloys thereof. Additionally, the second electrode 170 may be made of a conductive material such as ruthenium (Ru), tungsten (W), iridium (Ir), platinum (Pt), copper (Cu), titanium (Ti), tantalum (Ta), nickel (Ni), chromium (Cr), or the like, or alloys of ruthenium (Ru), tungsten (W), iridium (Ir), platinum (Pt), copper (Cu), titanium (Ti), tantalum (Ta), nickel (Ni), or chromium (Cr).

At least one step is formed in the second electrode 170 in the active region in which the first electrode 150, the piezoelectric layer 160, and the second electrode 170 are disposed to all overlap one another. For example, the second electrode 170 may have two areas in which the at least one step is formed, and having a smallest thickness in a central portion of the active region and a thickness at an edge portion of the active region that is different from the thickness at the central portion of the active region. In more detail, as illustrated in FIGS. 2 and 3, for example, the thickness of the second electrode 170 in a first region Z0 (e.g., an inner region in the central portion of the active region) may be formed to be the smallest, compared to the thickness of the second electrode 170 in other regions in the active region. In addition, in a second region Z1, which is disposed outside of the first region Z0, the thickness of the second electrode 170 is formed to be greater than the thickness of the second electrode 170 in the first region Z0. For example, in the second region Z1, the thickness of the second electrode 170 may be 500 to 1500 Å greater than the thickness of the second electrode 170 in the first region Z0. Additionally, the thickness of the second electrode 170 in a third region Z2, which is disposed outside of the second region Z1, is formed to be greater than the thickness of the second electrode 170 in the second region Z1.

As illustrated in FIGS. 2 and 3, the first electrode 150, the piezoelectric layer 160, and the second electrode 170 are disposed to overlap one another in the first to third regions Z0, Z1, and Z2.

Further, as illustrated in FIGS. 2 and 3, the first electrode 150, the insertion layer 180, the piezoelectric layer 160, and the second electrode 170 are disposed to overlap in a fourth region Z3, which is disposed outside of the third region Z2. The acoustic impedance of the insertion layer 180 material is lower than that of the first electrode 150, the piezoelectric layer 160, and the second electrode 170 material. Accordingly, reflection performance may be improved.

In addition, as illustrated in FIGS. 2 and 3, in a fifth region Z4, which is disposed outside of the fourth region Z3, the first electrode 150, the insertion layer 180, and the piezoelectric layer 160 may be disposed to overlap one another, or the insertion layer 180, the piezoelectric layer 160, and the second electrode 170 may be disposed to overlap one another.

Thus, as illustrated in FIGS. 2 and 3, the at least one step is formed on the second electrode 170 in the first to fifth regions Z0, Z1, Z2, Z3, and Z4.

As described above, reflection performance may be improved by reflecting a lateral wave having various wavelengths at a boundary of the first to fifth regions Z0, Z1, Z2, Z3, and Z4. Accordingly, it is possible to realize high quality factor (Q) performance at the anti-resonance point.

The insertion layer 180 is disposed between the first electrode 150 and the piezoelectric layer 160. The insertion layer 180 may be formed of a dielectric layer of silicon oxide ($SiO_2$), aluminum nitride (AlN), aluminum oxide ($Al_2O_3$), silicon nitride ($Si_3N_4$), manganese oxide (MgO), zirconium oxide ($ZrO_2$), lead zirconate titanate (PZT), and gallium Arsenic (GaAs), hafnium oxide ($HfO_2$), aluminum oxide ($Al_2O_3$), titanium oxide ($TiO_2$), zinc oxide (ZnO), or the like, but may be formed of a material different from that of the piezoelectric layer 160. In addition, if necessary, it is also possible to form a region in which the insertion layer 180 is in the form of an air gap. The air gap may be implemented by removing the insertion layer 180 in the manufacturing process.

As an example, the insertion layer 180 may be disposed along a surface of the membrane layer 140, the first electrode 150, and the etch stop portion 130. At least a portion of the insertion layer 180 may be disposed between the piezoelectric layer 160 and the first electrode 150.

The insertion layer 180 may be made of a material having acoustic impedance lower than the acoustic impedance of the first electrode 150.

The passivation layer 190 is formed in a region excluding portions of the first electrode 150 and the second electrode 170. The passivation layer 190 may prevent the second electrode 170 and the first electrode 150 from being damaged during a manufacturing process.

Additionally, a portion of the passivation layer 190 may be removed by etching to adjust a frequency characteristic in a final process of manufacturing. That is, the thickness of the passivation layer 190 may be adjusted. As an example, the passivation layer 190 may be formed of a dielectric layer containing any one of silicon nitride ($Si_3N_4$), silicon oxide ($SiO_2$), manganese oxide (MgO), zirconium oxide ($ZrO_2$), aluminum nitride (AlN), lead titanate (PZT), gallium arsenide (GaAs), hafnium oxide ($HfO_2$), aluminum oxide ($Al_2O_3$), titanium oxide ($TiO_2$), and zinc oxide (ZnO).

The metal pad 200 is formed on a portion of the first electrode 150 and the second electrode 160 on which the passivation layer 190, is not formed. As an example, the metal pad 200 may be made of a material such as gold (Au), a gold-tin (Au—Sn) alloy, copper (Cu), a copper-tin (Cu—Sn) alloy and aluminum (Al), an aluminum alloy, or the like. For example, the aluminum alloy may be an aluminum-germanium (Al—Ge) alloy.

The metal pad 200 may include a first metal pad 202 connected to the first electrode 150 and a second meal pad 204 connected to the second electrode 170.

As described above, reflection performance may be improved by a lateral wave having various wavelengths being reflected at a boundary of the first to fifth regions Z0, Z1, Z2, Z3, and Z4. Accordingly, it is possible to realize high quality factor (Q) performance at the anti-resonance point.

Hereinafter, an effect of the bulk-acoustic wave resonator 100 will be described.

Figure 4:
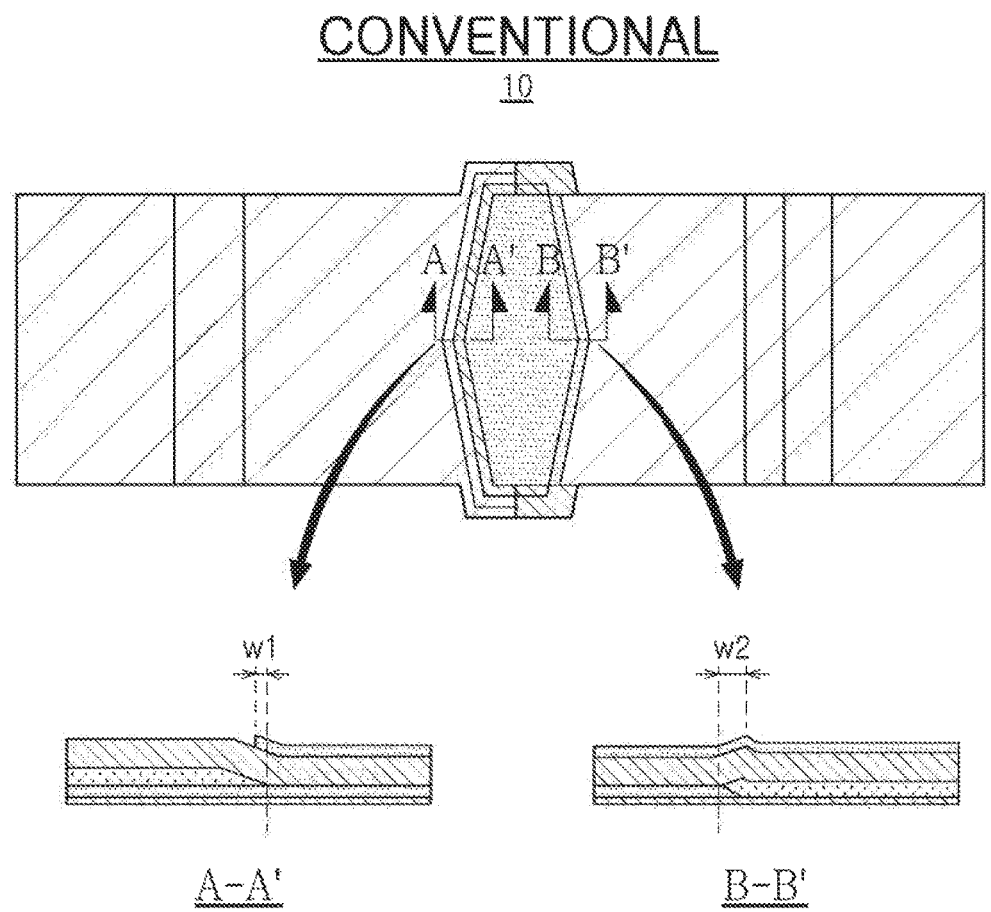
FIG. 4 is an explanatory view illustrating a conventional bulk-acoustic wave resonator.
Figure 5:
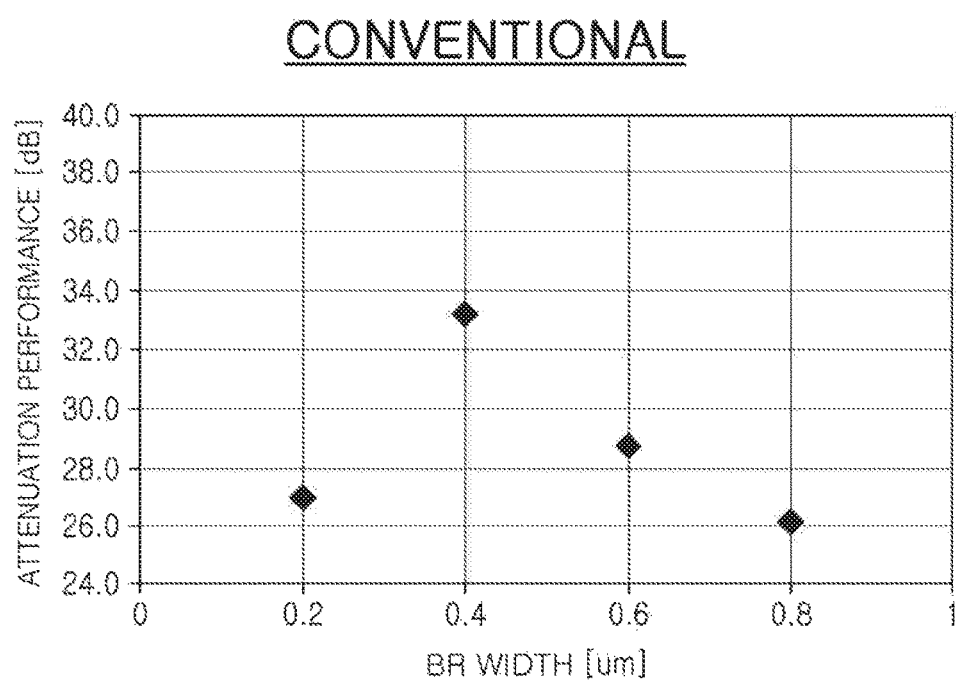
FIG. 5 is a graph illustrating attenuation performance according to a BR width in a conventional bulk-acoustic wave resonator.

FIG. 4 is an explanatory view illustrating a conventional bulk-acoustic wave resonator 10. FIG. 5 is a graph illustrating attenuation performance according to a BR width in the conventional bulk-acoustic wave resonator.

Referring to FIG. 4, the conventional bulk-acoustic wave resonator 10 has an area of 4,900 $\mu m^2$ and an aspect ratio (height/width ratio) of 2.4. While changing a BR width (w1) shown in a cross-section A-A', shown in FIG. 4, a BE width (w2) in a cross-section B-B', shown in FIG. 4, was made constant at 0.4 μm. As shown by this experiment in FIG. 5, when the BR width is 0.4 μm, the attenuation performance has a maximum value of 33.1 dB.

The BR width is a width of a region in which the insertion layer and the second electrode overlap each other, and the BE width (w2) is a width of a region where the first electrode and the insertion layer overlap each other, as shown in FIG. 3.

The performance of the conventional resonator 10 is shown in the following Table 1.

TABLE 1

| BR Width [μm] | BE width [μm] | Fs [GHz] | Fp [GHz] | $kt^2$ [%] | IL [dB] | Attn. [dB] |
|---|---|---|---|---|---|---|
| 0.6 | 0.4 | 3.5620 | 3.6895 | 8.24 | 0.036 | 28.7 |
| 0.4 |  | 3.5620 | 3.6905 | 8.30 | 0.036 | 33.1 |
| 0.2 |  | 3.5620 | 3.6915 | 8.36 | 0.036 | 26.9 |

Figure 6:
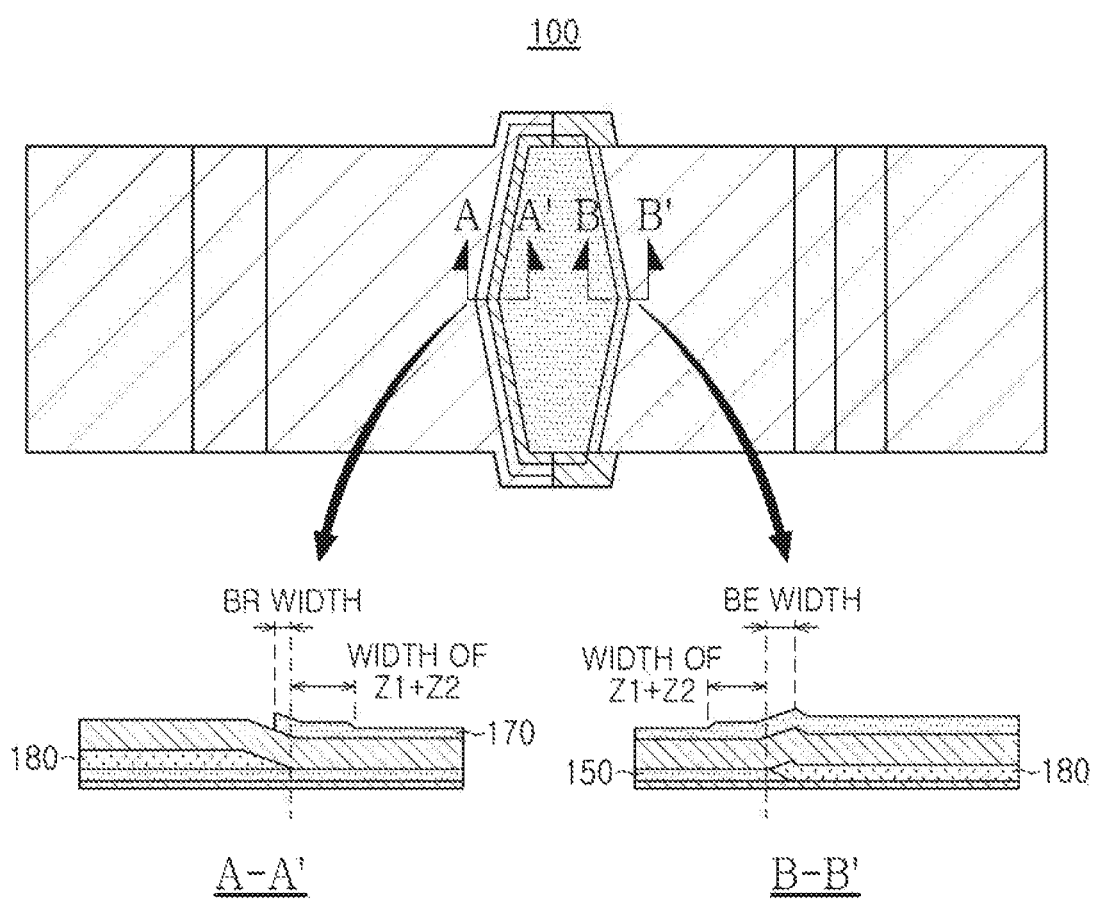
Figure 7:
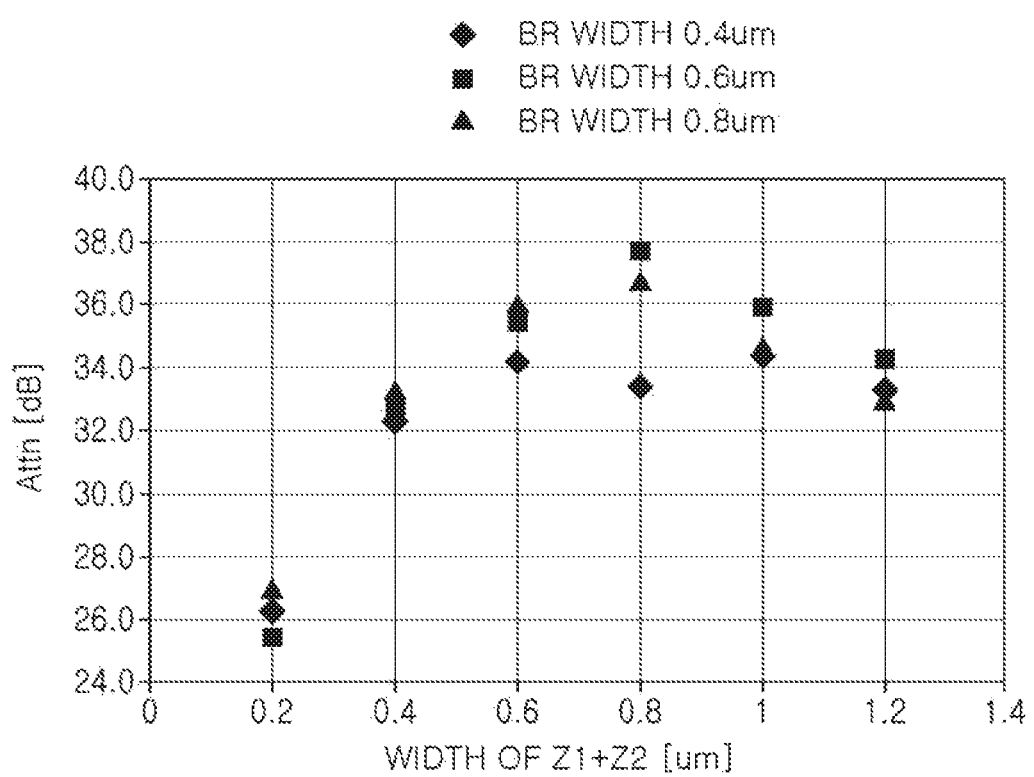
FIG. 7 is a graph illustrating attenuation performance when the BR width is 0.4 µm, 0.6 µm, and 0.8 µm in the bulk-acoustic wave resonator of FIG. 1.

FIG. 6 is an explanatory view illustrating the bulk-acoustic wave resonator 100, according to an embodiment. FIG. 7 is a graph illustrating attenuation performance of second and third regions Z1 and Z2 of the second electrode 170 when the BR width is 0.4 μm, 0.6 μm, and 0.8 μm in the bulk-acoustic wave resonator 100.

As illustrated in FIG. 7, the attenuation performance has a maximum value of 33.7 dB when the sum of the widths of the second and third regions Z1 and Z2 is 0.8 μm.

The performance exhibited by the bulk-acoustic wave resonator 100 according to the sum of the widths of the second and third regions Z1 and Z2 of the second electrode 170 is shown in Table 2 below.

TABLE 2

| BR Width [μm] | Width of Z1 + Z2 [μm] | Fs [GHz] | Fp [GHz] | $kt^2$ [%] | IL [dB] | Attn. [dB] |
|---|---|---|---|---|---|---|
| 0.6 | 1.0 | 3.5620 | 3.6830 | 7.85 | 0.037 | 35.9 |
|  | 0.8 | 3.5620 | 3.6850 | 7.97 | 0.037 | 37.7 |
|  | 0.6 | 3.5620 | 3.6865 | 8.06 | 0.037 | 35.3 |

Figure 8:
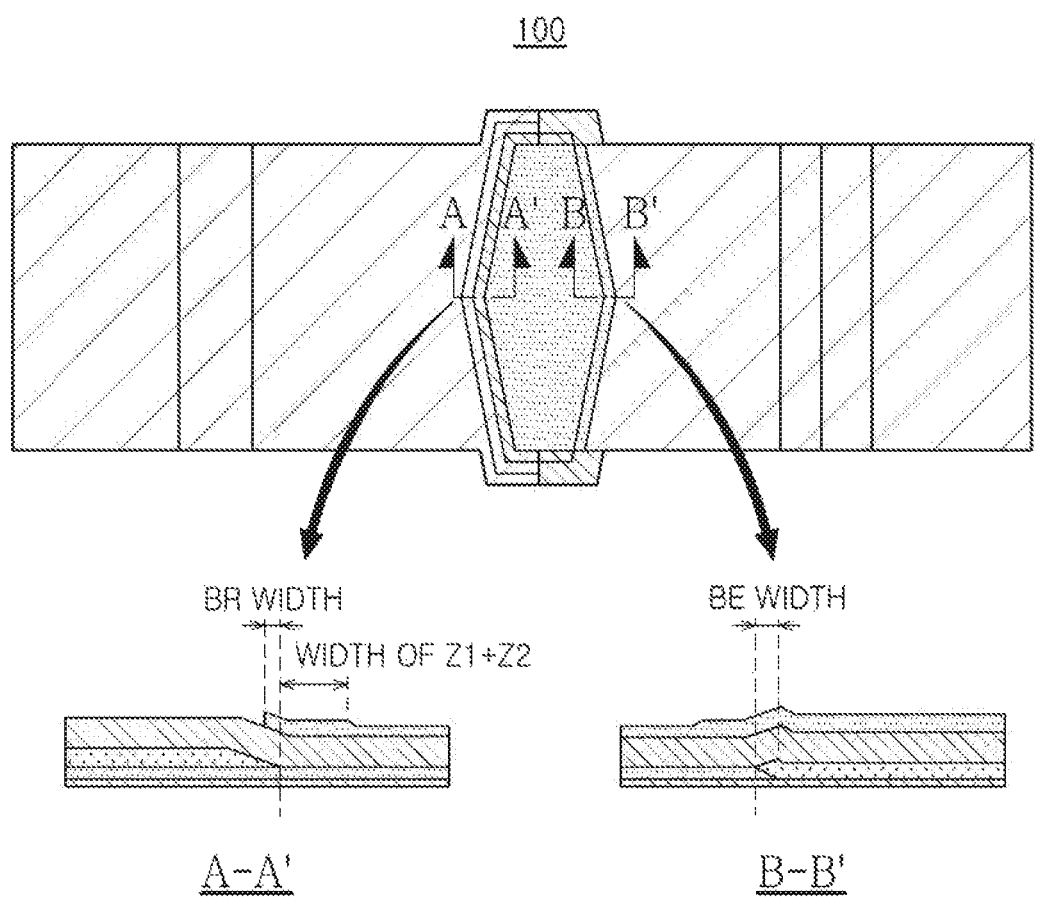
FIG. 8 is an explanatory view illustrating the bulk-acoustic wave resonator of FIG. 1, according to an embodiment.
Figure 9:
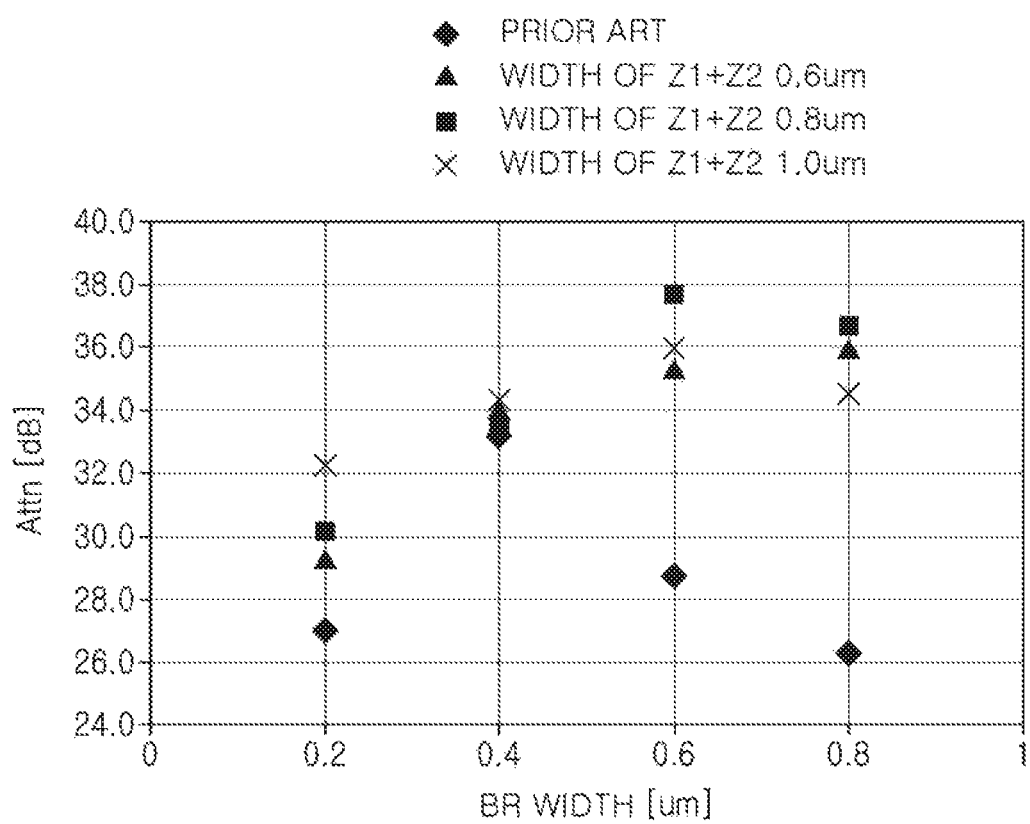
FIG. 9 is a graph illustrating attenuation performance of second and third regions of a second electrode when a sum of the widths of the second and third regions of the second electrode is 0.6 µm, 0.8 µm, or 1.0 µm in the bulk-acoustic wave resonator of FIG. 1.

FIG. 8 is an explanatory view illustrating the bulk-acoustic wave resonator 100, according to an embodiment. FIG. 9 is a graph illustrating attenuation performance according to the BR width when the sum of the widths of the second and third regions of the second electrode 170 is 0.6 μm, 0.8 μm, and 1.0 μm, in the bulk-acoustic wave resonator 100.

As illustrated in FIG. 9, the attenuation performance has a maximum value of 37.7 dB when the BR width (w1) is 0.6 μm.

The performance exhibited by the bulk-acoustic wave resonator 100 according to the BR width is shown in Table 3 below.

TABLE 3

| BR Width [μm] | Width of Z1 + Z2 [μm] | Fs [GHz] | Fp [GHz] | $kt^2$ [%] | IL [dB] | Attn. [dB] |
|---|---|---|---|---|---|---|
| 0.8 | 0.8 | 3.5620 | 3.6845 | 7.94 | 0.037 | 36.7 |
| 0.6 |  | 3.5620 | 3.6850 | 7.97 | 0.037 | 37.7 |
| 0.4 |  | 3.5620 | 3.6855 | 8.00 | 0.037 | 33.4 |

Figure 10:
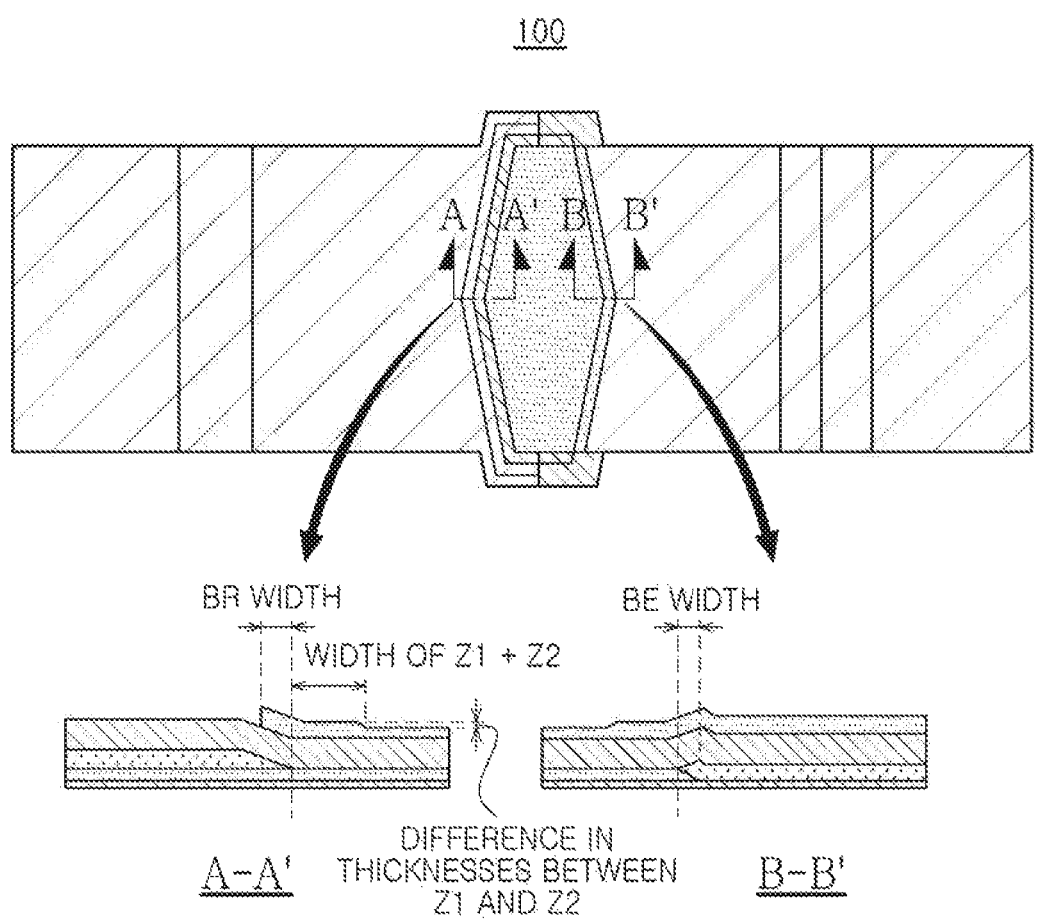
FIG. 10 is an explanatory view illustrating the bulk-acoustic wave resonator of FIG. 1, according to an embodiment.
Figure 11:
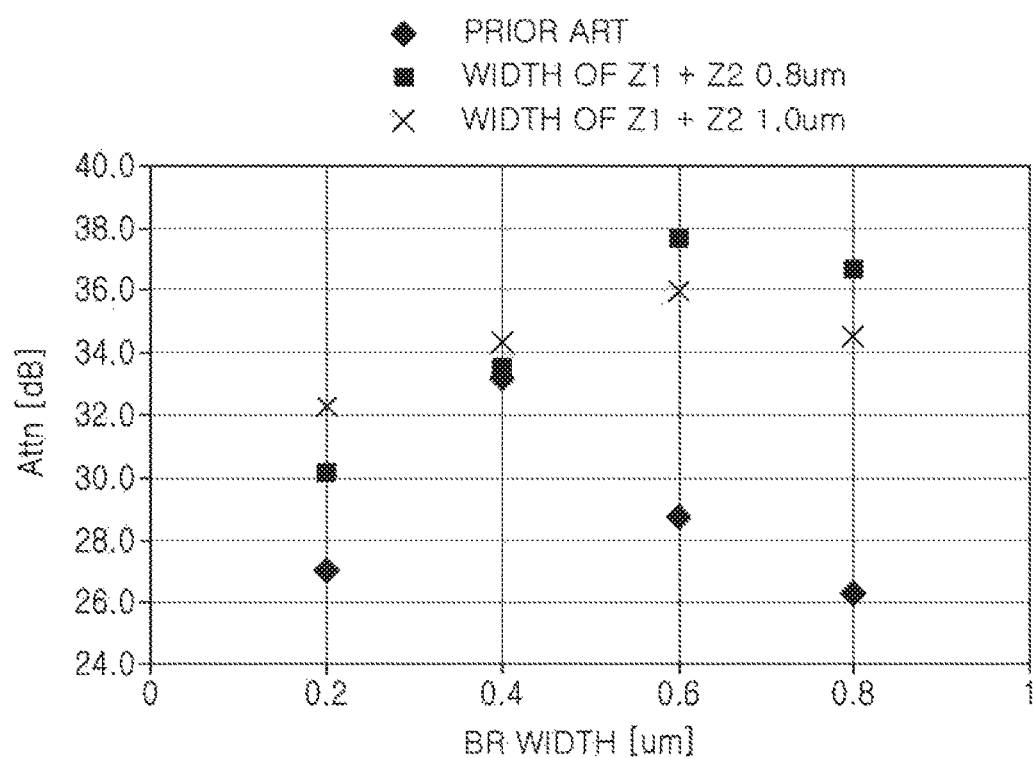
FIG. 11 is a graph illustrating attenuation performance according to the BR width, when a difference in thickness between the first and second regions of the second electrode is 1000 Å, and the sum of the widths of the second and third regions of the second electrode is 0.8 µm and 1.0 µm, in the bulk-acoustic wave resonator of FIG. 1.
Figure 12:
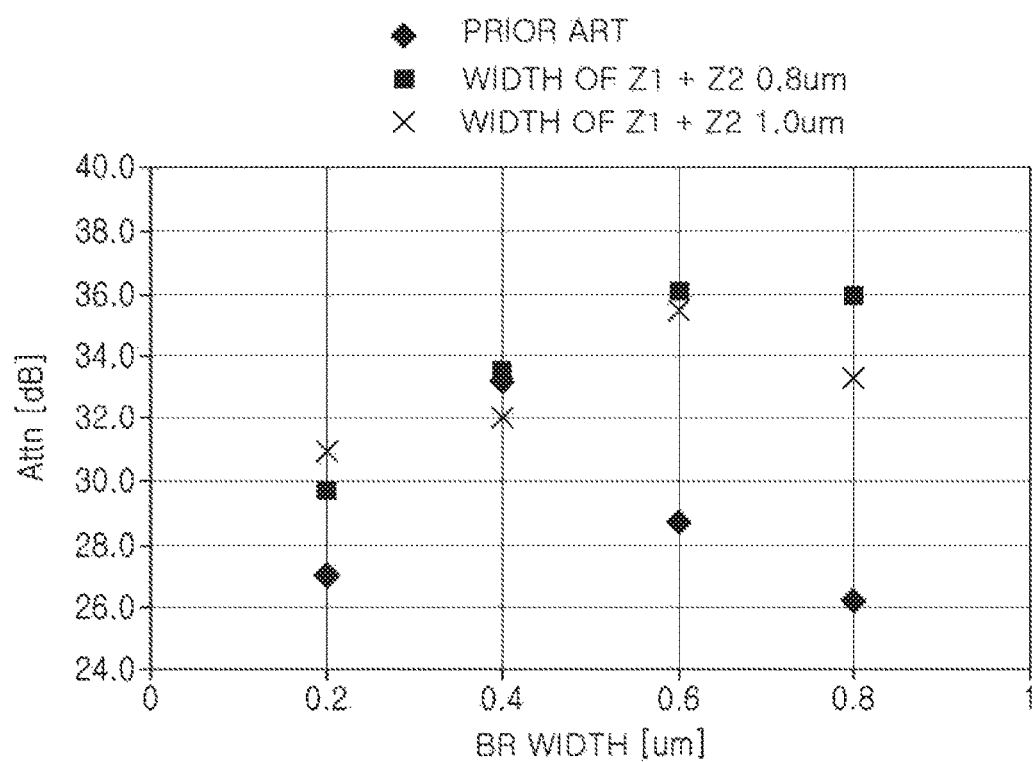
FIG. 12 is a graph illustrating attenuation performance according to the BR width, when a difference in thickness between the first and second regions of the second electrode is 1100 Å, and the sum of the widths of the second and third regions of the second electrode is 0.8 µm and 1.0 µm, in the bulk-acoustic wave resonator of FIG. 1.
Figure 13:
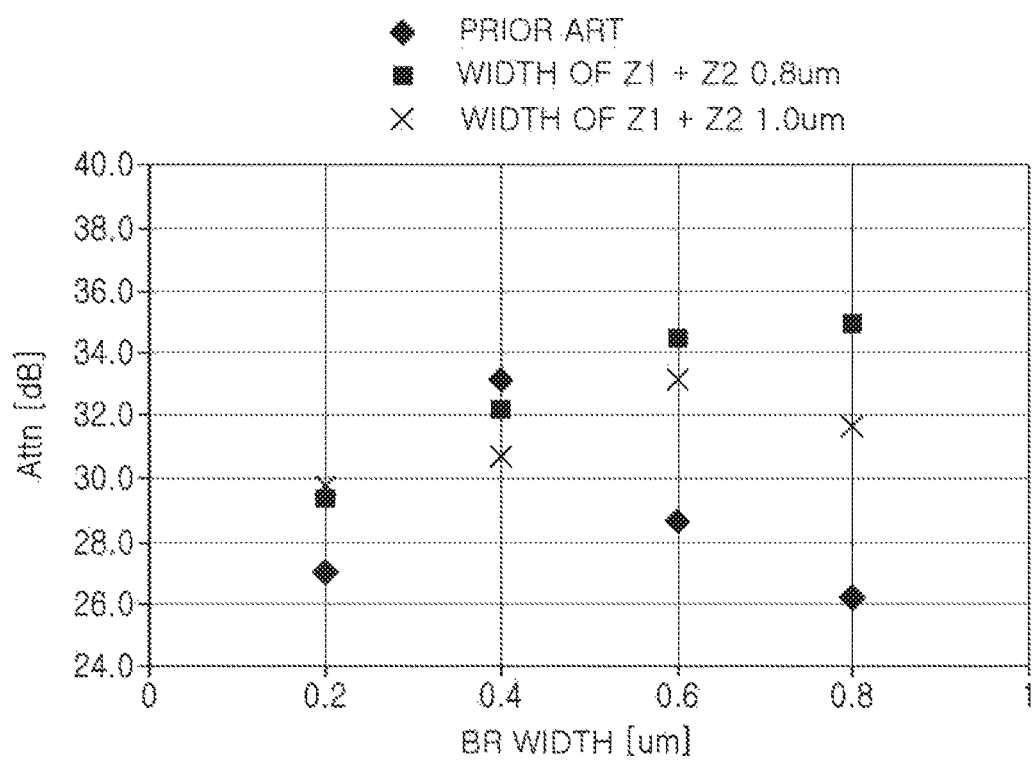
FIG. 13 is a graph illustrating attenuation performance according to the BR width, when a difference in thickness between the first and second regions of the second electrode is 1200 Å, and the sum of the widths of the second and third regions of the second electrode is 0.8 µm and 1.0 µm, in the bulk-acoustic wave resonator of FIG. 1.

FIG. 10 is an explanatory view illustrating the bulk-acoustic wave resonator 100, according to an embodiment. FIG. 11 is a graph illustrating attenuation performance according to the BR width, when a difference in thickness between the first and second regions Z0 and Z1 of the second electrode 170 is 1000 Å, and the sum of the widths of the second and third regions Z1 and Z2 of the second electrode 170 is 0.8 μm and 1.0 μm, in the bulk-acoustic wave resonator 100. FIG. 12 is a graph illustrating attenuation performance according to the BR width, when a difference in thickness between the first and second regions Z0 and Z1 of the second electrode 170 is 1100 Å, and the sum of the widths of the second and third regions Z1 and Z2 of the second electrode 170 is 0.8 μm and 1.0 μm, in the bulk-acoustic wave resonator 100, according to an embodiment. FIG. 13 is a graph illustrating attenuation performance according to the BR width, when a difference in thickness between the first and second regions Z0 and Z1 of the second electrode 170 is 1200 Å, and the sum of the widths of the second and third regions Z1 and Z2 of the second electrode is 0.8 μm and 1.0 μm, in the bulk-acoustic wave resonator 100, according to an embodiment.

As shown in FIGS. 11 to 13, the attenuation performance has a maximum value of 37.7 dB when the difference in thickness is 1000 Å.

Although the difference in thickness between the first and second regions Z0 and Z1 of the second electrode 170 is described as 1000 Å to 1200 Å in an example, attenuation performance of the second electrode 170 may be improved when the difference in thickness between the first and second regions is 800 Å to 1200 Å.

TABLE 4

| BR Width [μm]/width of Z1 + Z2 [μm] | Difference in thickness between Z1 and Z0 [Å] | Fs [GHz] | Fp [GHz] | $kt^2$ [%] | IL [dB] | Attn. [dB] |
|---|---|---|---|---|---|---|
| 0.6/0.8 | 1000 | 3.5620 | 3.6850 | 7.97 | 0.037 | 37.7 |
| 0.6/0.8 | 1100 | 3.5620 | 3.6845 | 7.94 | 0.037 | 35.8 |
| 0.6/0.8 | 1200 | 3.5620 | 3.6840 | 7.91 | 0.037 | 34.5 |

Hereinafter, modified embodiments of the bulk-acoustic wave resonator 100 described above will be described. However, in the following discussion of FIGS. 14 and 15, detailed descriptions of components shared with the previously described embodiments will be not be repeated.

Figure 14:
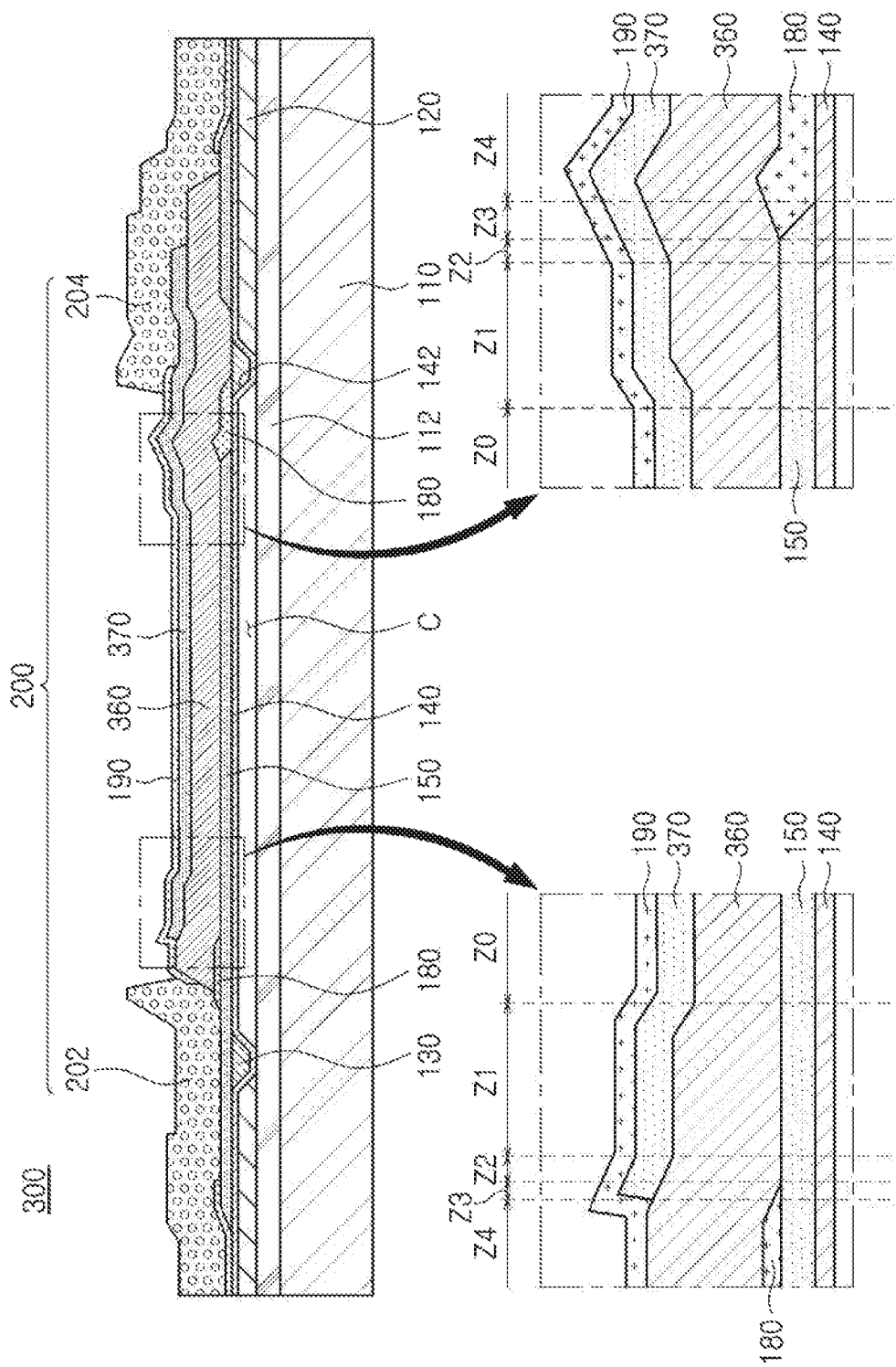
FIG. 14 is a schematic cross-sectional view illustrating a bulk-acoustic wave resonator, according to an embodiment.

FIG. 14 is a schematic cross-sectional view illustrating a bulk-acoustic wave resonator 300, according to an embodiment.

Referring to FIG. 14, the bulk-acoustic wave resonator 300 may include, for example, the substrate 110, the sacrificial layer 120, the etch stop portion 130, the membrane layer 140, the first electrode 150, a piezoelectric layer 360, a second electrode 370, the insertion layer 180, the passivation layer 190, and the metal pad 200. Thus, the bulk-acoustic wave resonator 300 differs from the bulk-acoustic wave resonator 100 in that the bulk-acoustic wave resonator 300 includes the piezoelectric layer 360 and the second electrode 370 instead of the piezoelectric layer 160 and the second electrode 170.

The piezoelectric layer 360 is formed to cover at least the portion of the first electrode 150 disposed above the cavity C. The piezoelectric layer 360 is a portion that generates a piezoelectric effect that converts electrical energy into mechanical energy in a form of elastic waves, and may include, for example, an aluminum nitride (AlN) material.

In addition, dopants such as rare earth metal or transition metal may be doped into the piezoelectric layer 360. As an example, the rare earth metal used as a dopant may include any one or any combination of any two or more of scandium (Sc), erbium (Er), yttrium (Y), and lanthanum (La). Furthermore, the transition metal used as a dopant may include any one or any combination of any two or more of titanium (Ti), zirconium (Zr), hafnium (Hf), tantalum (Ta), and niobium (Nb). In addition, the piezoelectric layer 360 may also include magnesium (Mg), which is a divalent metal.

In addition, the piezoelectric layer 360 may be made of a material having a low acoustic impedance compared to the acoustic impedance of the first electrode 150.

At least one step is formed in the piezoelectric layer 360 in the active region in which the first electrode 150 and the piezoelectric layer 360 and the second electrode 370 are all disposed to overlap one another. As an example, the piezoelectric layer 360 may have a region in which the at least one step is formed, and having a smallest thickness in a central portion of the active region and a thickness at an edge portion of the active region that is different from the thickness at the central portion. In more detail, for example, the thickness of the piezoelectric layer 360 in the first region Z0 (e.g., an inner region in the central portion of the active region) may be formed to be the smallest compared to the thickness of the piezoelectric layer 360 in other regions in the active region. In addition, in the second region Z1, which is disposed outside of the first region Z0, the thickness of the piezoelectric layer 360 is formed to be greater than the thickness of the piezoelectric layer 360 in the first region Z0. In addition, the thickness of the piezoelectric body 360 in the second region Z1 may be 500 to 1500 Å greater than the thickness of the piezoelectric layer 360 in the first region Z0. In the third region Z2, which is disposed outside of the second region Z1, the thickness of the piezoelectric layer 360 is formed to be greater than the thickness of the piezoelectric layer 360 in the second region Z1.

In the first to third regions Z0, Z1, and Z3, the first electrode 150, the piezoelectric layer 360, and the second electrode 370 are disposed to overlap one another.

In the fourth region Z3, which is disposed outside of the third region Z2, the first electrode 150, the piezoelectric layer 360, and the second electrode 370 are disposed to overlap one another. In addition, the acoustic impedance of the insertion layer 180 may be lower than that of the first electrode 150, the piezoelectric layer 360, and the second electrode 370. Accordingly, reflection performance may be improved.

In addition, in a fifth region Z4, which is disposed outside of the fourth region Z3, the first electrode 150, the insertion layer 180, and the piezoelectric layer 360 are disposed to overlap one another, or the insertion layer 180, the piezoelectric layer 360, and the second electrode 370 are disposed to overlap one another.

Thus, as illustrated in FIG. 14, the at least one step is formed on the piezoelectric layer 360 in the first to fifth regions Z0, Z1, Z2, Z3, and Z4.

As described above, reflection performance may be improved by a lateral wave having various wavelengths being reflected at a boundary of the first to fifth regions Z0, Z1, Z2, Z3, and Z4. Accordingly, it is possible to realize high quality factor (Q) performance at the anti-resonance point.

The second electrode 370 may be formed to cover at least a portion of the piezoelectric layer 360 disposed above the cavity C. The second electrode 370 may be configured as either one of an input electrode and an output electrode for inputting and outputting, respectively, an electrical signal such as a radio frequency (RF) signal. That is, when the first electrode 150 is configured as the input electrode, the second electrode 370 may be configured as the output electrode, and when the first electrode 150 is configured as the output electrode, the second electrode 370 may be configured as the input electrode.

As an example, the second electrode 370 may be formed of a conductive material such as molybdenum (Mo) or alloys thereof. However, the second electrode 370 is not limited to these examples, and the second electrode 370 may be made of a conductive material such as ruthenium (Ru), tungsten (W), iridium (Ir), platinum (Pt), copper (Cu), titanium (Ti), tantalum (Ta), nickel (Ni), chromium (Cr), or the like, or alloys of ruthenium (Ru), tungsten (W), iridium (Ir), platinum (Pt), copper (Cu), titanium (Ti), tantalum (Ta), nickel (Ni), or chromium (Cr).

Figure 15:
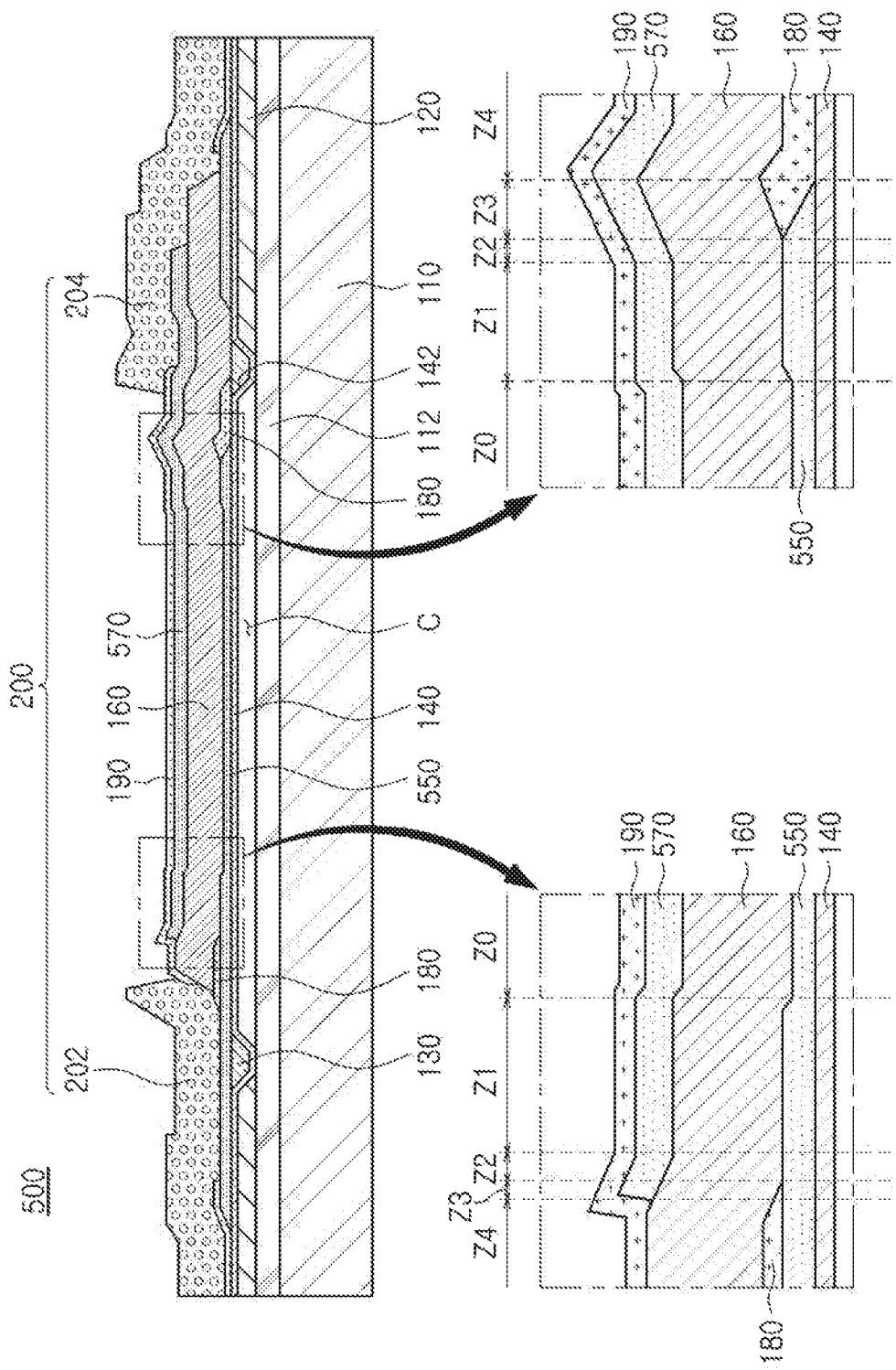
FIG. 15 is a schematic cross-sectional view illustrating a bulk-acoustic wave resonator, according to an embodiment.

FIG. 15 is a cross-sectional view illustrating a bulk-acoustic wave resonator 500, according to an embodiment.

Referring to FIG. 15, the bulk-acoustic wave resonator 500 may include, for example, the substrate 110, the sacrificial layer 120, the etch stop portion 130, the membrane layer 140, a first electrode 550, the piezoelectric layer 160, a second electrode 570, the insertion layer 180, the passivation layer 190, and the metal pad 200. Thus, the bulk-acoustic wave resonator 500 differs from the bulk-acoustic resonator 100 in that the bulk-acoustic wave resonator 500 includes the first electrode 550 and the second electrode 570 instead of the first electrode 150 and the second electrode 170.

The first electrode 550 is formed on the membrane layer 140, and a portion of the first electrode 550 is disposed above the cavity C. In addition, the first electrode 550 may be configured as either one of an input electrode and an output electrode for inputting and outputting, respectively, an electrical signal such as a radio frequency (RF) signal, or the like.

As an example, the first electrode 550 may be formed of a conductive material such as molybdenum (Mo) or alloys thereof. However, the first electrode 550 is not limited to these examples, and the first electrode 550 may be made of a conductive material such as ruthenium (Ru), tungsten (W), iridium (Ir), platinum (Pt), copper (Cu), titanium (Ti), tantalum (Ta), nickel (Ni), chromium (Cr), or the like, or alloys of (Ru), tungsten (W), iridium (Ir), platinum (Pt), copper (Cu), titanium (Ti), tantalum (Ta), nickel (Ni), or chromium (Cr).

At least one step is formed in the first electrode 550 in the active region where the first electrode 550, the piezoelectric layer 160, and the second electrode 570 are all disposed to overlap one another. As an example, the first electrode 550 may have a region in which the at least one step is formed, and having a smallest thickness at a central portion of the active region and a thickness at an edge portion of the active region that is different from the thickness at the central portion. For example, the thickness of the first electrode 550 in the first region Z0 (e.g., an inner region in the central portion of the active region) is formed to be the smallest compared to other regions. In addition, in the second region Z1, which is disposed outside of the first region Z0, the thickness of the first electrode 550 is formed to be greater than the thickness of the first electrode 550 in the first region Z0. In addition, in the second region Z1, the thickness of the first electrode 550 may be 500 to 1500 Å greater than the thickness of the first electrode 550 in the first region Z0. The third region Z2 is disposed outside of the second region Z1.

In the first to third regions Z0, Z1, and Z2, the first electrode 550, the piezoelectric layer 160, and the second electrode 570 are disposed to overlap one another.

In the fourth region Z3, which is disposed outside of the third region Z2, the first electrode 550, the insertion layer 180, the piezoelectric layer 160, and the second electrode 570 are disposed to overlap one another. In addition, the acoustic impedance of the insertion layer 180 may be lower than the acoustic impedance of the first electrode 550, the piezoelectric layer 360, and the second electrode 570. Accordingly, reflection performance may be improved.

In addition, in the fifth region Z4, the first electrode 550, the insertion layer 180, and the piezoelectric layer 160 are disposed to overlap, or the insertion layer 180, the piezoelectric layer 160, and the second electrode 570 are disposed to overlap.

Thus, as illustrated in FIG. 15, the at least one step is formed on the first electrode 550 in the first to fifth regions Z0, Z1, Z2, Z3, and Z4.

As described above, reflection performance may be improved by a lateral wave having various wavelengths being reflected at a boundary of the first to fifth regions Z0, Z1, Z2, Z3, and Z4. Accordingly, it is possible to realize high quality factor (Q) performance at the anti-resonance point.

The second electrode 570 is formed to cover at least a portion of the piezoelectric layer 150 disposed above the cavity C. The second electrode 570 may be configured as either one of an input electrode and an output electrode for inputting and outputting, respectively, an electrical signal such as a radio frequency (RF) signal, or the like. That is, when the first electrode 550 is configured as the input electrode, the second electrode 570 may be configured as the output electrode, and when the first electrode 550 is configured as the output electrode, the second electrode 570 may be configured as the input electrode.

As an example, the second electrode 570 may be formed of a conductive material such as molybdenum (Mo) or alloys thereof. However, the second electrode is not limited to these examples, and the second electrode 570 may be made of a conductive material such as ruthenium (Ru), tungsten (W), iridium (Ir), platinum (Pt), copper (Cu), titanium (Ti), tantalum (Ta), nickel (Ni), chromium (Cr), or the like, or alloys of a conductive material such as ruthenium (Ru), tungsten (W), iridium (Ir), platinum (Pt), copper (Cu), titanium (Ti), tantalum (Ta), nickel (Ni), or chromium (Cr).

As set forth above, according to the disclosure herein, a lateral wave reflection performance of a bulk-acoustic wave resonator may be improved.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. In addition, respective embodiments may be combined with each other. For example, the pressing members disclosed in the above-described embodiments may be used in combination with each other in one force sensing device. Therefore, the scope of the disclosure is defined not by the detailed description, but by the claims and their equivalents, and all variations within the scope of the claims and their equivalents are to be construed as being included in the disclosure.

What is claimed is:

1. A bulk-acoustic wave resonator, comprising:
    a first electrode disposed above a substrate;
    a piezoelectric layer disposed to cover at least a portion of the first electrode;
    a second electrode disposed to cover at least a portion of the piezoelectric layer; and
    an insertion layer,
    wherein a plurality of steps are formed in any one or any combination of any two or more of the first electrode, the piezoelectric layer, and the second electrode in an active region in which the first electrode, the piezoelectric layer, and the second electrode are all disposed to overlap one another, and
    wherein a portion of the insertion layer is disposed between the first electrode and the piezoelectric layer.

2. The bulk-acoustic wave resonator of claim 1, wherein a thickness of one of the first electrode, the piezoelectric layer, and the second electrode at an edge of the active region is greater than a thickness of the one of the first electrode, the piezoelectric layer, and the second electrode in a central portion of the active region to form a step, among the plurality of steps.

3. The bulk-acoustic wave resonator of claim 1, further comprising:
    an etch stop portion disposed to surround a cavity;
    a sacrificial layer disposed to surround the etch stop portion; and
    a metal pad connected to the first electrode and the second electrode.

4. The bulk-acoustic wave resonator of claim 1, wherein:
    a thickness of the second electrode in a first region of the bulk-acoustic wave resonator is smallest compared to thicknesses of the second electrode in other regions in the active region;
    a thickness of the second electrode in a second region of the bulk-acoustic wave resonator, disposed outside of the first region, is greater than the thickness of the second electrode in the first region;
    a thickness of the second electrode in a third region of the bulk-acoustic wave resonator, disposed outside of the second region, is greater than the thickness of the second electrode in the second region; and
    the second electrode overlaps the piezoelectric layer, the first electrode, and the insertion layer in a fourth region of the bulk-acoustic wave resonator, disposed outside of the third region.

5. The bulk-acoustic wave resonator of claim 4, wherein the second electrode overlaps the piezoelectric layer, the insertion layer, and the first electrode in a fifth region of the bulk-acoustic wave resonator, disposed outside of the fourth region, or
    wherein the second electrode, the piezoelectric layer, and the insertion layer overlap one another in the fifth region.

6. The bulk-acoustic wave resonator of claim 4, wherein a sum of a width of the second region and a width of the third region is 0.6 μm to 1.0 μm.

7. The bulk-acoustic wave resonator of claim 4, wherein a width of a region in which an end portion of the second electrode overlaps the insertion layer is 0.4 μm to 0.8 μm.

8. The bulk-acoustic wave resonator of claim 4, wherein a difference between the thickness of the second electrode in the first region and the thickness of the second electrode in the second region is 800 Å to 1200 Å.

9. The bulk-acoustic wave resonator of claim 1, wherein:
    a thickness of the piezoelectric layer in a first region of the bulk-acoustic wave resonator is smallest compared to thicknesses of the piezoelectric layer in other regions in the active region;
    a thickness of the piezoelectric layer in a second region of the bulk-acoustic wave resonator, disposed outside of the first region, is greater than the thickness of the piezoelectric layer in the first region;
    a thickness of the piezoelectric layer in a third region of the bulk-acoustic wave resonator, disposed outside of the second region, is greater than the thickness of the piezoelectric layer in the second region; and the piezoelectric layer, the first and second electrodes, and the insertion layer overlap one another in a fourth region of the bulk-acoustic wave resonator, disposed outside of the third region.

10. The bulk-acoustic wave resonator of claim 9, wherein the piezoelectric layer, the insertion layer, and the first electrode overlap one another in a fifth region of the bulk-acoustic wave resonator, disposed outside of the fourth region, or wherein the second electrode, the piezoelectric layer, and the insertion layer overlap one another in the fifth region.

11. The bulk-acoustic wave resonator of claim 1, wherein:

a thickness of the first electrode in a first region of the bulk-acoustic wave resonator is smallest compared to thicknesses of the first electrode in other regions in the active region;

a thickness of the first electrode in a second region of the bulk-acoustic wave resonator, disposed outside of the first region, is greater than the thickness of the first electrode the first region;

the first electrode is disposed in a third region of the bulk-acoustic wave resonator, disposed outside of the second region, and the first and second electrodes, and the insertion layer overlap one another in a fourth region of bulk-acoustic wave resonator, disposed outside of the third region.

12. The bulk-acoustic wave resonator of claim 11, wherein the piezoelectric layer, the insertion layer, and the first electrode overlap one another in a fifth region of bulk-acoustic wave resonator, disposed outside of the fourth region, or wherein the second electrode, the piezoelectric layer, and the insertion layer overlap one another in the fifth region.

13. The bulk-acoustic wave resonator of claim 1, wherein an acoustic impedance of the piezoelectric layer is greater than an acoustic impedance of the first and second electrodes.

14. A bulk-acoustic wave resonator, comprising:

a first electrode disposed above a substrate;

a piezoelectric layer disposed to cover at least a portion of the first electrode;

a second electrode disposed to cover at least a portion of the piezoelectric layer; and an insertion layer partially disposed between the first electrode and the piezoelectric layer, wherein a plurality of steps are formed by the insertion layer and a difference in thickness of regions of any one of the first electrode, the piezoelectric layer, and the second electrode, in an active region in which the first electrode, the piezoelectric layer, and the second electrode all overlap one another.

15. The bulk-acoustic wave resonator of claim 14, wherein an acoustic impedance of the piezoelectric layer is greater than an acoustic impedance of the first and second electrodes.

16. The bulk-acoustic wave resonator of claim 14, wherein:

a thickness of the any one of the first electrode, the piezoelectric layer, and the second electrode in a first region of the bulk-acoustic wave resonator is smallest compared to thicknesses of the any one of the first electrode, the piezoelectric layer, and the second electrode in other regions in the active region; and a thickness of the any one of the first electrode, the piezoelectric layer, and the second electrode in a second region of the bulk-acoustic wave resonator, disposed outside of the first region, is greater than the thickness of the any one of the first electrode, the piezoelectric layer, and the second electrode in the first region; and a difference between the thickness of the any one of the first electrode, the piezoelectric layer, and the second electrode in the first region and the thickness of the any one of the first electrode, the piezoelectric layer, and the second electrode in the second region is 800 Å to 1200 Å.

17. The bulk-acoustic wave resonator of claim 14, wherein:

a thickness of the second electrode in a first region of the bulk-acoustic wave resonator is smallest compared to thicknesses of the second electrode in other regions in the active region;

a thickness of the second electrode in a second region of the bulk-acoustic wave resonator, disposed outside of the first region, is greater than the thickness of the second electrode in the first region;

a thickness of the second electrode in a third region of the bulk-acoustic wave resonator, disposed outside of the second region, is greater than the thickness of the second electrode in the second region; and the second electrode overlaps the piezoelectric layer, the first electrode, and the insertion layer in a fourth region of the second electrode, disposed outside of the third region.

18. The bulk-acoustic wave resonator of claim 17, wherein the second electrode overlaps the piezoelectric layer, the insertion layer, and the first electrode in a fifth region of the bulk-acoustic wave resonator, disposed outside of the fourth region; or the second electrode, the piezoelectric layer, and the insertion layer overlap one another in the fifth region.

19. The bulk-acoustic wave resonator of claim 17, wherein a sum of a width of the second region and a width of the third region is 0.6 µm to 1.0 µm.

20. The bulk-acoustic wave resonator of claim 17, wherein a width of a region in which an end portion of the second electrode overlaps the insertion layer is 0.4 µm to 0.8 µm.

21. The bulk-acoustic wave resonator of claim 17, wherein the insertion layer is not disposed in the third region.

22. The bulk-acoustic wave resonator of claim 14, wherein:

a thickness of the piezoelectric layer in a first region of the bulk-acoustic wave resonator is smallest compared to thicknesses of the piezoelectric layer in other regions in the active region;

a thickness of the piezoelectric layer in a second region of the bulk-acoustic wave resonator, disposed outside of the first region, is greater than the thickness of the piezoelectric layer in the first region;

a thickness of the piezoelectric layer in a third region of the bulk-acoustic wave resonator, disposed outside of the second region, is greater than the thickness of the piezoelectric layer in the second region; and the piezoelectric layer, the first and second electrodes, and the insertion layer overlap one another in a fourth region of the bulk-acoustic wave resonator, disposed outside of the third region.

23. The bulk-acoustic wave resonator of claim 22, wherein the piezoelectric layer, the insertion layer, and the first electrode overlap one another in a fifth region of the bulk-acoustic wave resonator, disposed outside of the fourth region; or the second electrode, the piezoelectric layer, and the insertion layer overlap one another in the fifth region.

24. The bulk-acoustic wave resonator of claim 14, wherein:

a thickness of the first electrode in a first region of the bulk-acoustic wave resonator is smallest compared to thicknesses of the first electrode in other regions in the active region;

a thickness of the first electrode in a second region of the bulk-acoustic wave resonator, disposed outside of the first region, is greater than the thickness of the first electrode in the first region;

the first electrode is disposed in a third region of the bulk-acoustic wave resonator, disposed outside of the second region; and the piezoelectric layer, the first and second electrodes, and the insertion layer overlap one another in a fourth region of the bulk-acoustic wave resonator, disposed outside of the third region.

25. The bulk-acoustic wave resonator of claim 24, wherein the piezoelectric layer, the insertion layer, and the first electrode overlap one another in a fifth region of the bulk-acoustic wave resonator, disposed outside of the fourth region; or the second electrode, the piezoelectric layer, and the insertion layer overlap one another in the fifth region.

26. A bulk-acoustic wave resonator, comprising:
a first electrode disposed above a substrate;
a piezoelectric layer disposed to cover at least a portion of the first electrode; and
a second electrode disposed to cover at least a portion of the piezoelectric layer;
wherein the first electrode, the piezoelectric layer, and the second electrode all overlap one another throughout an active region of the bulk-acoustic wave resonator,
wherein any one of the first electrode, the piezoelectric layer, and the second electrode has a first thickness in a first region of the active region, a second thickness in a second region of the active region, disposed outside of the first region, and a third thickness in a third region of the active region, and
wherein the second thickness is greater than the first thickness, and
wherein the third thickness is greater than the second thickness.

27. The bulk-acoustic wave resonator of claim 26, further comprising an insertion layer partially disposed between the first electrode and the piezoelectric layer,
wherein the insertion layer is disposed entirely outside of the third region.

28. The bulk-acoustic resonator of claim 26, further comprising a step formed in the any one of the first electrode, the piezoelectric layer, and the second electrode by a difference between the first thickness and the second thickness.

29. The bulk-acoustic wave resonator of claim 28, wherein the difference between the first thickness and the second thickness is 800 Å to 1200 Å.

* * * * *